(12) United States Patent
Cho et al.

(10) Patent No.: US 7,571,276 B2
(45) Date of Patent: Aug. 4, 2009

(54) READ OPERATION FOR SEMICONDUCTOR MEMORY DEVICES

(75) Inventors: Hyun-Duk Cho, Suwon-si (KR); Tae-Gyun Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 345 days.

(21) Appl. No.: 11/542,140

(22) Filed: Oct. 4, 2006

(65) Prior Publication Data
US 2007/0076484 A1 Apr. 5, 2007

(30) Foreign Application Priority Data
Oct. 4, 2005 (KR) .................. 10-2005-0093011

(51) Int. Cl.
*G06F 12/00* (2006.01)
(52) U.S. Cl. .............. 711/103; 365/185.21; 365/185.08
(58) Field of Classification Search .................. 711/103; 365/185.21, 185.08
See application file for complete search history.

(56) References Cited

U.S. PATENT DOCUMENTS

| | | | |
|---|---|---|---|
| 5,754,469 A * | 5/1998 | Hung et al. ............ | 365/185.03 |
| 6,744,692 B2 | 6/2004 | Shiota et al. | |
| 6,775,185 B2 | 8/2004 | Fujisawa et al. | |
| 6,791,877 B2 | 9/2004 | Miura et al. | |
| 7,136,978 B2 * | 11/2006 | Miura et al. ............ | 711/165 |
| 7,411,859 B2 * | 8/2008 | Sohn et al. ............ | 365/230.05 |
| 2002/0083262 A1 * | 6/2002 | Fukuzumi ............ | 711/103 |
| 2005/0146939 A1 * | 7/2005 | Conley et al. ........ | 365/185.22 |

FOREIGN PATENT DOCUMENTS

| | | |
|---|---|---|
| JP | 08249894 | 9/1996 |
| JP | 2002366429 | 12/2002 |
| JP | 2003-233529 | 8/2003 |
| JP | 2003-317487 | 11/2003 |
| JP | 2004013337 | 1/2004 |
| JP | 2004102781 | 4/2004 |
| KR | 1020030067494 | 8/2003 |
| KR | 1020030082917 | 10/2003 |
| KR | 10-2004-0097272 | 11/2004 |
| WO | WO-03/085676 | 10/2003 |

* cited by examiner

*Primary Examiner*—Kevin L Ellis
*Assistant Examiner*—Hashem Farrokh
(74) *Attorney, Agent, or Firm*—Volentine & Whitt, PLLC

(57) ABSTRACT

Disclosed is a method of performing a read operation in a NAND/RAM semiconductor memory device. The semiconductor memory device comprises a NAND flash memory device having a memory cell array and a page buffer, and a data RAM outputting data in response to a clock signal received from a host. The method comprising; sensing data stored in one page of the memory cell array in the page buffer, transferring the sensed data from the page buffer to the data RAM in multiple blocks via a corresponding number of transfer operations, and reading the transferred data from the data RAM in response to the host clock signal, wherein a read-out operation for the transferred data commences during any one of the plurality of transfer time periods.

11 Claims, 5 Drawing Sheets

READ OPERATION FOR SEMICONDUCTOR MEMORY DEVICES

BACKGROUND OF THE INVENTION

1. Field of the Invention

Embodiments of the present invention relate generally to a semiconductor memory devices. More specifically, embodiments of the invention relate to a read operation for semiconductor memory devices, such as NAND/RAM memory devices.

This application claims priority to Korean Patent Application No. 2005-93011 filed Oct. 4, 2005, the subject matter of which is hereby incorporated by reference.

2. Discussion of Related Art

A great variety of semiconductor memory devices are used in contemporary electronic systems to store data. Semiconductor memory devices include a Random Access Memory (RAM) and a Read Only Memory (ROM). A RAM is a volatile memory device that loses stored data when its power is turned OFF. A ROM is a nonvolatile memory device that retains stored data even when its power is turned OFF.

RAM includes the Dynamic RAM (DRAM), Static RAM (SRAM), etc. ROM includes the programmable ROM (PROM), erasable PROM (EPROM), electrically EPROM (EEPROM), NAND flash memory, NOR flash memory, etc.

Regardless of the particular form of semiconductor memory device, stored data is retrieved from a semiconductor memory device using an operation generically referred to as a "read operation".

Recently, a new type of semiconductor memory device (hereafter broadly referred to as a "NAND/RAM memory device") has been actively investigated and developed that enjoys advantages commonly associated with both NAND flash memory and data RAM. That is, the NAND/RAM memory device is implemented with both NAND flash memory and data RAM sections integrated in a single memory device. During a program operation of the NAND/RAM memory device, data from an external circuit (hereafter generically referred to as a "host") is first written into the data RAM and thereafter stored programmed into the NAND flash memory.

During a subsequent read operation, data stored in the NAND flash memory is output to the host via the data RAM in response to a read command received from the host. Thus, the NAN D/RAM memory device typically performs a read operation as follows. First, in the NAND flash memory, a page buffer senses data (e.g., page data) from a page of memory cells, and the sensed data is temporally stored in the page buffer. The sensed data in the page buffer is then transferred to the data RAM. The host then fetches data from the data RAM in synchronization with a clock signal.

As with any memory device, the NAND/RAM memory device must be able to program data or have data read from it in a time period defined by the host. As the operation speed of various hosts is increased, this requirement has begun to stress the operating capabilities of conventional NAND/RAM memory devices.

For example, the ultimate speed of a read operation performed in a NAND/RAM memory device is limited by the time it takes to sense data from the memory cell array of the NAND memory using a page buffer.

FIG. (FIG.) 1 is a timing diagram illustrating a read operation for a conventional NAND/RAM memory device. Referring to FIG. 1, in order to provide requested data to the host, the NAND/RAM memory device must perform a sensing operation carried out during a sense time tS, a transfer operation during a transfer time tT, and a read-out operation during a readout time tR. The read-out operation is performed responsive to a clock signal CLK received from the host. Under these circumstances, if the frequency of the host clock signal CLK is increased, the readout time tR must be correspondingly decreased.

Unfortunately, although the frequency of the host clock signal CLK increases, the overall read operation speed for the NAND/RAM memory device is not increased, because the overall read operation speed is a function of the fixed sensing time tS. Thus, the conventional NAND/RAM memory device exhibits a read operation speed insensitive to changes in the host clock signal CLK.

SUMMARY OF THE INVENTION

Embodiments of the invention provide a read operation for a semiconductor memory device capable of increasing the overall speed of the read operation in proportion to an increase in the frequency of a host clock signal.

In one embodiment, the invention provides a method of performing a read operation in a NAND/RAM memory device, the NAND/RAM memory device comprising a NAND flash memory having a memory cell array and a page buffer; and a data RAM configured to output data in response to a clock signal received from a host. The method comprises; sensing data stored in one page of the memory cell array in the page buffer, transferring the sensed data from the page buffer to the data RAM in multiple blocks via a corresponding number of transfer operations, and reading the transferred data from the data RAM in response to the host clock signal, wherein a read-out operation for the transferred data commences during any one of the plurality of transfer time periods.

DESCRIPTION OF EMBODIMENTS

The present invention will be described more fully hereinafter with reference to the accompanying drawings, in which exemplary embodiments of the invention are shown.

Figure 1:
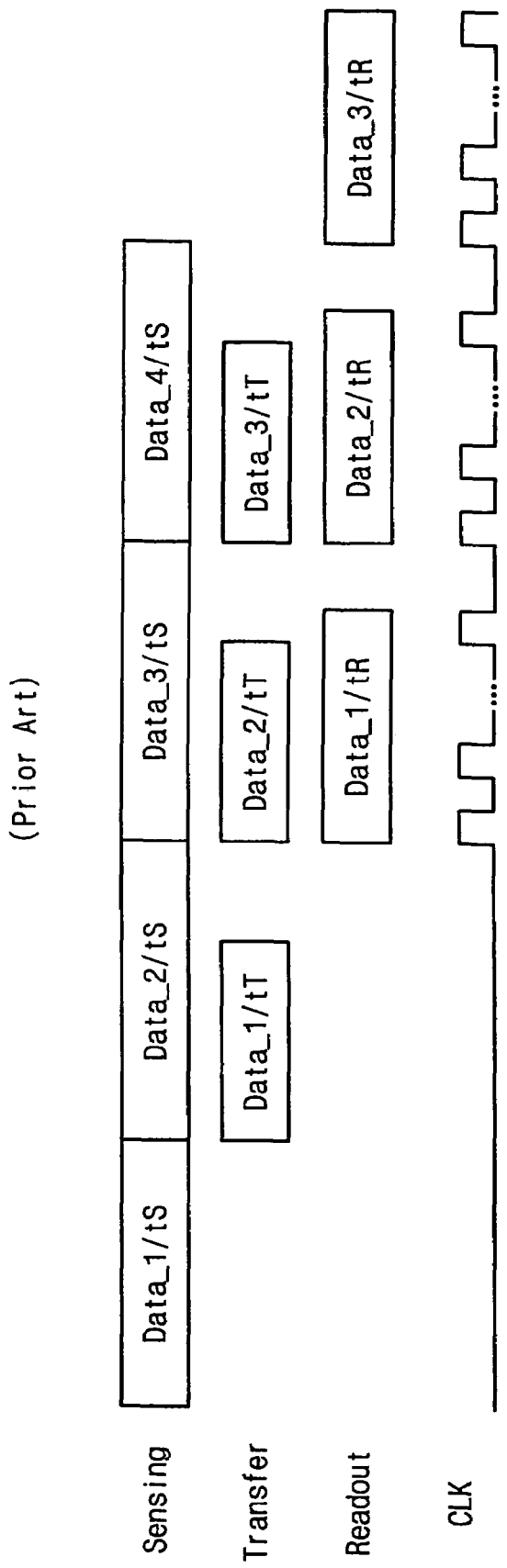
FIG. 1 is a timing diagram illustrating a read operation for a conventional NAND/RAM memory device.
Figure 2:
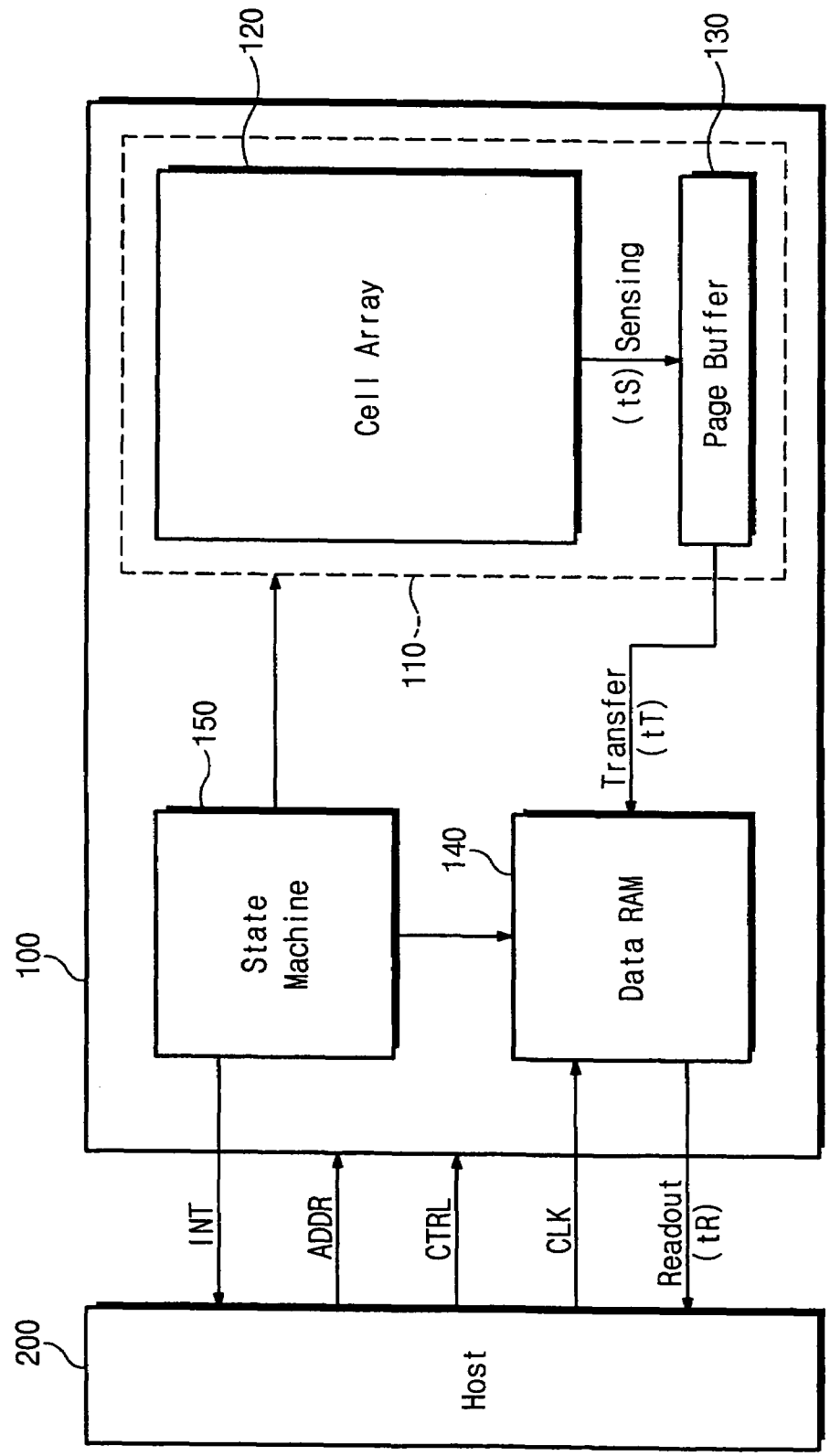
FIG. 2 is a block diagram illustrating a semiconductor memory device designed in accordance with an embodiment of the invention, as well as a related host.

Referring to FIG. 2, a semiconductor memory device 100 according to an embodiment of the invention comprises a NAND flash memory 110, a data RAM 140, and a state machine 150. Semiconductor memory device 100 is assumed to include a One NAND flash memory device. NAND flash memory 100 generally comprises a memory cell array 120 and an associated page buffer 130.

Memory cell array 120 includes a plurality of memory blocks (not shown), each of which comprises a plurality of memory pages. A memory page is a set of memory cells commonly coupled to a single word line. In NAND flash memory 100, read and program operations are performed on a page unit basis, while an erase operation is performed on a block unit basis. Page buffer 130 stores data to be programmed in memory cell array 120 as well as data sensed from memory cell array 120. Page buffer 130 is connected to memory cell array 120 through a plurality of bit lines. During a read operation, page buffer 130 senses the charge state of memory cells in a selected page and temporarily stores the sensed data. This phase of the read operation is commonly called the sensing operation. As illustrated in FIG. 2, the sensing of data from memory cell array 120 by means of page buffer 130 is performed during a predetermined sense time period tS.

Data RAM 140 stores data to be programmed to or read from NAND flash memory 110. Data RAM 140 may be implemented with a DRAM, a SRAM, or similar memory device.

During a program operation, data RAM 140 receives data from host 200 and transfers it to NAND flash memory 110. During a read operation, data RAM 140 stores data received from page buffer 130 and outputs the data to host 200 in synchronization with a host clock signal CLK. The phase of a read operation wherein data is sent to data RAM 140 from page buffer 130 is called a transfer operation. As illustrated in FIG. 2, the transfer operation is performed during a predetermined transfer time period tT.

State machine 150 receives address ADDR and control CTRL signals from host 200, and in response controls the operation of semiconductor memory device 100. Thus, state machine 150 controls read operations for NAND flash memory 110 and data RAM 140. In addition, state machine 150 provides a control signal INT to host 200 during the read operation. The control signal INT will be more fully discussed hereinafter Host 200 generates the address ADDR and control CTRL signals to control the read operation performed by semiconductor memory device 100. The address ADDR signal(s) may be used to specify a page in memory cell array 120. The control CTRL signal(s) may be used to enable semiconductor memory device 100 during a read operation.

Host 200 also applies the clock signal CLK to data RAM 140 during the read operation. Data RAM 140 outputs data in response to the clock signal CLK. The rate of data output from data RAM 140 to host 200 is dependant upon the frequency of the clock signal CLK. That is, as the frequency of the clock signal CLK increases, the data output rate also increases. This phase of the read operation is called the read-out operation and is performed during the read-out time period tR.

According to an embodiment of the present invention, if the frequency of the clock signal CLK increases, so too does the speed of the read operation performed by semiconductor memory device 100. This result will be more fully described hereinafter with reference to FIGS. 3 and 4.

Figure 3:
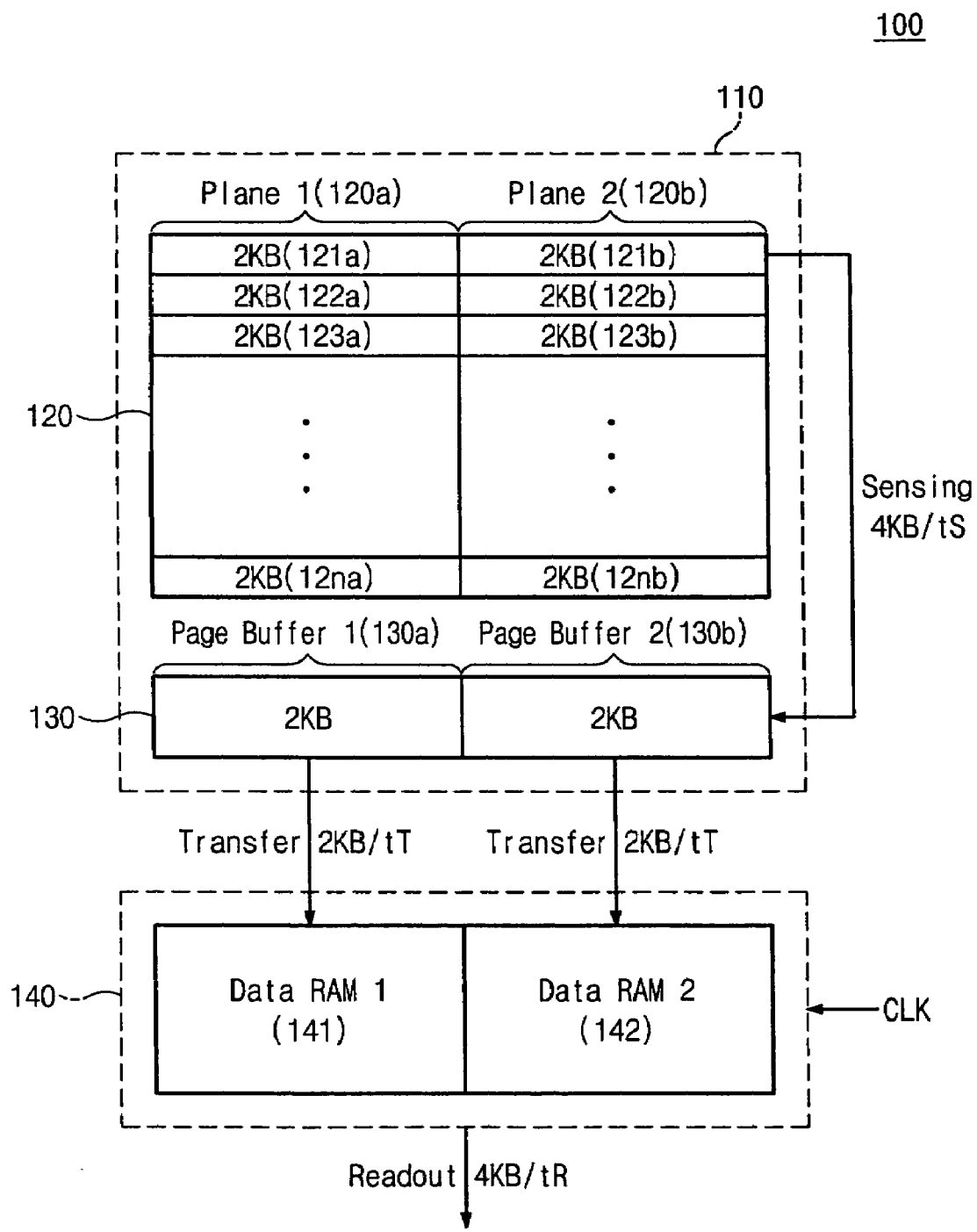
FIG. 3 is a block diagram further illustrating an exemplary internal organization of the semiconductor memory device of FIG. 2.

FIG. 3 is a block diagram of an exemplary internal organization of semiconductor memory device 100. Referring to FIG. 3, semiconductor memory device 100 comprises a NAND flash memory 110 and data RAM 140. NAND flash memory 110 comprises memory cell array 120 and page buffer 130. Memory cell array 120 is divided into a first plane 120a and a second plane 120b. Page buffer 130 is divided into a first buffer 130a and a second buffer 130b. Data RAM 140 comprises a first data RAM 141 and a second data RAM 142. Thus, as illustrated in FIG. 3, each one of memory cell array 120, page buffer 130, the data RAM 140 is divided into two (2) separate areas. However, this division into multiple areas may be done differently in other embodiments of the invention.

Returning to FIG. 3, memory cell array 120 comprises a plurality of pages 121-12n. NAND flash memory 110 may be configured to read data on a page by page basis. Respective pages may be further configured to have two page areas. In the illustrated example, one page area is associated with first plane 120a and the other page area is associated with second plane 120b. In one more specific embodiment, as illustrated in FIG. 3, 4 KB of data is stored in each page equally divided between the two page areas.

Page buffer 130 is divided into a first page buffer 130a and a second page buffer 130b respectively associated with first plane 120a and second plane 120b. First page buffer 130a senses data from a selected page in first plane 120a. Second page buffer 130b senses data from the selected page in second plane 120b. Thus, the 4 KB of data in first page 121 is sensed by page buffer 130 during sense time tS.

Data RAM 140 receives data from page buffer 130 with the 2 KB of data in first page buffer 130a being transferred to first data RAM 141 during the transfer time tT Once the data is completely transferred to first data RAM 141, the 2 KB of data in second page buffer 130b is transferred to second data RAM 142 during the transfer time tT.

Data in data RAM 140 is read in synchronization with the host clock signal CLK. That is, host 200 fetches 4 KB data stored in first and second data RAMs 141 and 142 in synchronization with the clock signal CLK. The read-out time tR required to read data from data RAM 140 to host 200 is determined based on a frequency of the host clock signal CLK. Accordingly, as the frequency of the host clock signal CLK increases, the read-out time tR decreases proportionally.

According to the semiconductor memory device in FIG. 3, read operation speed is increased in proportion to decreases in the read-out time tR. That is, read operation speed of semiconductor memory device 100 increases in proportion with increasing frequency of the host clock signal CLK. This will be more fully described with reference to FIG. 4.

Figure 4:
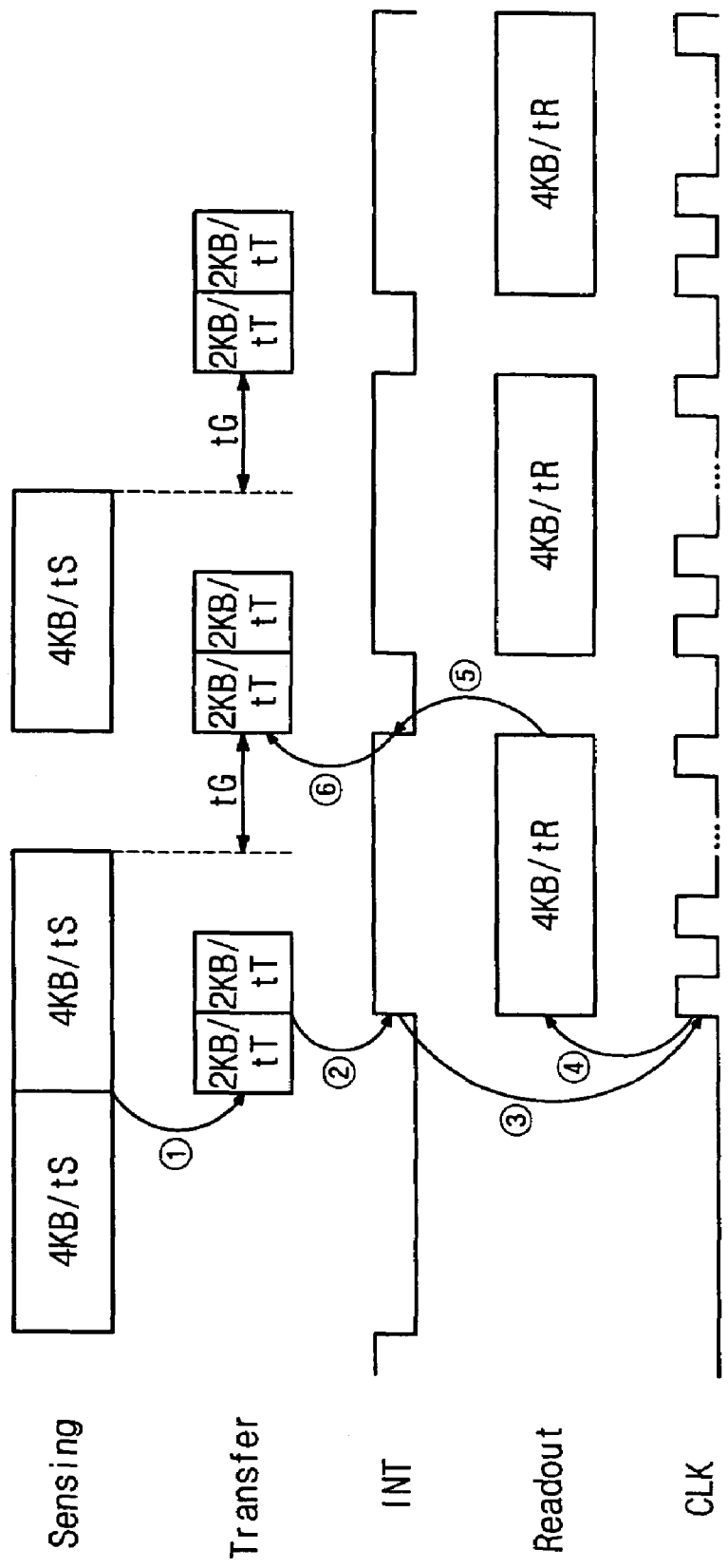
FIG. 4 is a timing diagram illustrating an operation of the semiconductor memory device in FIG. 3.

FIG. 4 is a timing diagram illustrating a read operation for a semiconductor memory device according to an embodiment of the invention. The read operation of semiconductor memory device 100 comprises a sensing operation, a transfer operation and a read-out operation. FIG. 4 shows an exemplary read operation related to first through third pages 121 to 123.

During the sense time tS, 4 KB of data in first page 121 is sensed by page buffer 130. When the sensing of the 4 KB of data in first page 121 is completed, this data is transferred from page buffer 130 to data RAM 140 (①). Second page 122 is sensed while this first 4 KB of data is being transferred from page buffer 130 to data RAM 140.

During a first transfer time tT, 2 KB of data from first page 130a is sent to first data RAM 141. During a second transfer time tT, 2 KB of data from second page buffer 130b is transferred to second data RAM 142. That is, the data transfer operation from page buffer 130 to data RAM 140 is performed in two passes. Of note, it is possible to reduce an operating current by performing the data transfer operation twice using 2 KB data blocks. That is, current consumption is halved as compared with a case wherein 4 KB of data is transferred to data RAM 140 from page buffer 130 all at once.

Meanwhile, when the data is completely transferred from first page buffer 130a to first data RAM 141, a control signal INT transitions, in this example, from a logically low level (a "low") to a logically high level (a "high") (②). Host 200 provides the clock signal CLK to data RAM 140 in response to the transition of the INT signal (③). 4 KB of data from data RAM 140 is then sent to the host in synchronization with the clock signal CLK during the read-out time tR (④).

When transferring of the 4 KB of data from data RAM 140 is complete, the control signal INT transitions from high to low under control of state machine 150 (⑤). Host 200 stops outputting the clock signal CLK in response to this high-low transition of the control signal INT. That is, host 200 interrupts the clock signal CLK upon detecting a low-high transition of the control signal INT The 4 KB of data stored in first page 121 is output to host 200 according to the above-mentioned procedures.

When the read operation of first page 121 is completed, 4 KB of data in second page 122 is sensed by page buffer 130 and transferred to data RAM 140 in two (2) 2 KB blocks of data unit (⑥). Then, the 4 KB of data stored in second page 122 is transferred to host 200 in the same manner as described above (See, ③ through ⑤). Likewise, the read operation for data stored in third page 123 is performed in the same manner as described above.

As shown by the example of FIG. 4, if the frequency of the host clock signal CLK increases, a read time tR for 4 KB data is correspondingly decreased. A gain time tG in FIG. 4 is decreased as the read time tR is decreased.

That is, within the context of an embodiment of the present invention, read operation speed for a semiconductor memory device is varied as a function of the frequency of a host clock signal CLK. For example, if the frequency of the host clock signal CLK increases, the read time tR decreases. On the other hand, if the frequency of the host clock signal CLK decreases, the read time tR increases.

In addition, semiconductor memory device 100 shown in FIG. 3 performs a double transfer operation, wherein data is transferred from page buffer 130 to data RAM 140 in multiple (e.g. divided) blocks. If data is completely transferred from page buffer 130 to first data RAM 141, host 200 starts reading out data from first data RAM 141. Thus, the read operation speed for embodiments of the present invention is much faster than those associated with conventional semiconductor memory devices.

Figure 5:
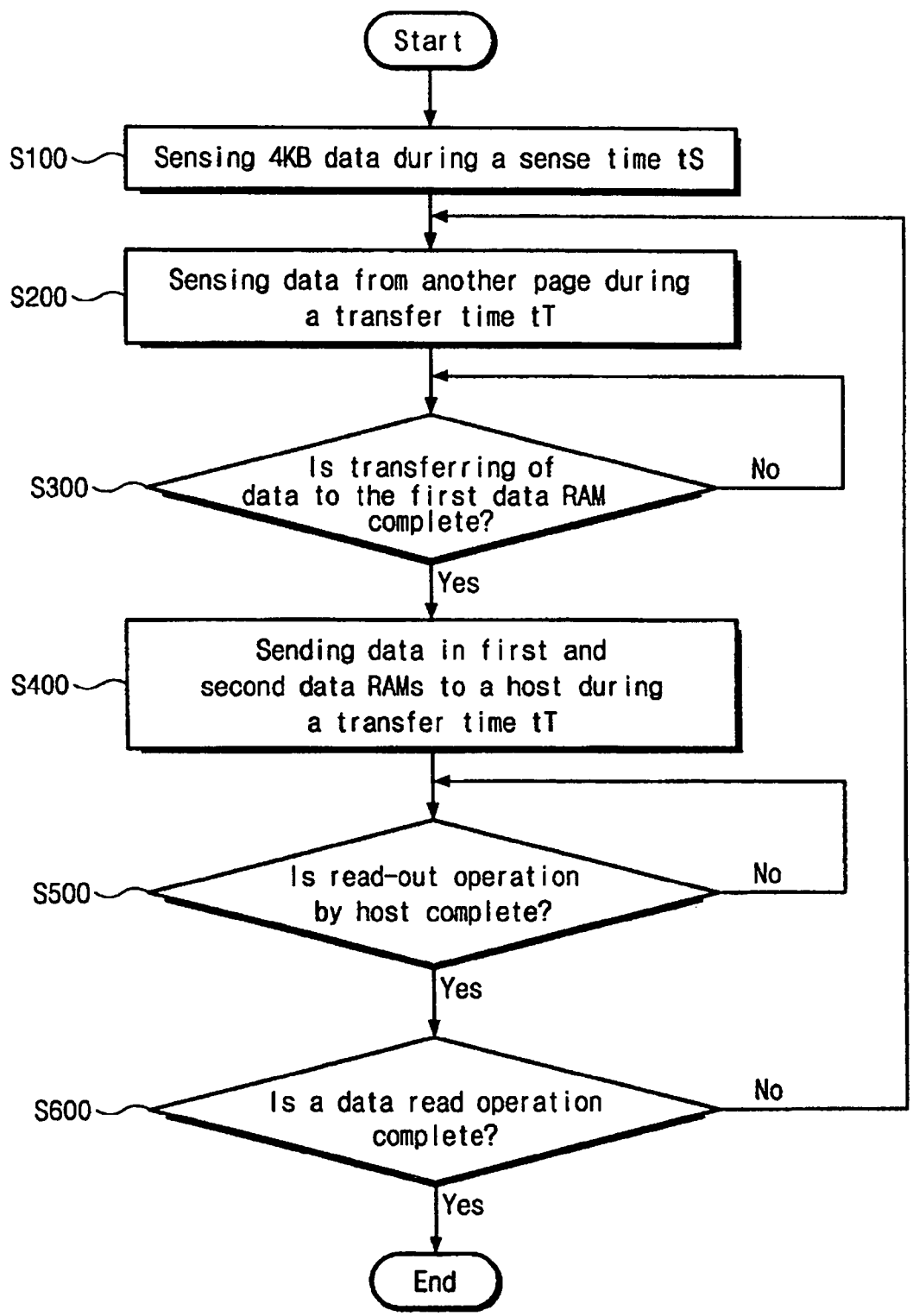
FIG. 5 is a flow chart illustrating a read operation for a semiconductor memory device designed in accordance with an embodiment of the invention.

FIG. 5 is a flow chart illustrating an exemplary read operation for a semiconductor memory device according to an embodiment of the present invention. The read operation illustrated in FIG. 5 should be considered with reference to FIGS. 3 and 4.

To begin, 4 KB of data in first page 121 is sensed by page buffer 130 during the sense time tS (S100). Then, the 2 KB of data sensed by first page buffer 130*a* is transferred to first data RAM 141 during a first transfer time tT, while the 4 KB of data in second page 122 is sensed by page buffer 130 (S200).

It is then determined whether the transfer of data from first page buffer 130*a* to first data RAM 141 is completed (S300). If the transfer of data from first page buffer 130*a* to first data RAM 141 is complete, the operation continues. That is, the 2 KB of data sensed by second page buffer 130*b* is transferred to second data RAM 142 during a second transfer time tT (S400). Host 200 fetches 4 KB data from first and second data RAMs 141 and 142 in synchronization with the clock signal CLK during a read-out time tR. It is then determined whether the 4 KB of data in first and second data RAMs 141 and 142 has been sent to host 200 (S500). If the 4 KB of data in first and second data RAMs 141 and 142 has been sent to host 200, the operation continues. That is, it is determination whether the read operation is complete (S600). If not, the operation returns to step S200. Otherwise, the read operation is ended.

The present invention has been described in the context of several embodiments. Those of ordinary skill in the art will recognize that changes may be made to the foregoing without removing such implementations from the scope of the invention as defined by the following claims.

What is claimed is:

1. A method of performing a read operation in a memory device, the memory device comprising a NAND flash memory having a memory cell array and a page buffer; and a data RAM configured to output data in response to a clock signal received from a host, wherein the data RAM comprises a first data RAM and a second data RAM, the method comprising:

sensing data stored in one page of the memory cell array in the page buffer;

transferring the sensed data from the page buffer to the data RAM in multiple blocks via a corresponding number of transfer operations by transferring a first block of sensed data from the page buffer to the first data RAM, and afterwards, transferring a second block of sensed data from the page buffer to the second data RAM; and reading the transferred data from the data RAM in response to the host clock signal, wherein a read-out operation for the transferred data commences during any one of the plurality of transfer time periods.

2. The method of claim 1, wherein the read-out operation is performed at the same time as transferring the second block of sensed data.

3. The method of claim 1, further comprising:

during the transferring of the first block of sensed data, sensing data from another page of data in the memory cell array using the page buffer.

4. The method of claim 1, further comprising:

upon completing the transferring of the first block of sensed data, outputting a control signal from the memory device to the host.

5. The method of claim 4, wherein the control signal comprises a low-high transition detected by the host.

6. The method of claim 4, further comprising:

upon detecting the to the low-high transition of the control signal, the host outputs the clock signal to the memory device.

7. The method of claim 4, further comprising:

outputting the control signal having a high-low transition to the host after the read-out operation is complete.

8. The method of claim 7, wherein the host stops outputting the clock signal in response to the high-low transition of the control signal.

9. The method of claim 1, wherein during transferring of the sensed data, data from another page in the memory array is sensed by the page buffer.

10. The method of claim 9, further comprising after the read-out operation:

transferring the sensed data of another page from the page buffer to the data RAM in multiple blocks via a corresponding number of transfer operations.

11. The method of claim 1, wherein the memory device is a One NAND flash memory device.

* * * * *